(12) United States Patent
Tamai et al.

(10) Patent No.: US 9,777,251 B2
(45) Date of Patent: Oct. 3, 2017

(54) LIQUID COMPOSITION FOR REMOVING TITANIUM NITRIDE, SEMICONDUCTOR-ELEMENT CLEANING METHOD USING SAME, AND SEMICONDUCTOR-ELEMENT MANUFACTURING METHOD

(71) Applicant: MITSUBISHI GAS CHEMICAL COMPANY, INC., Chiyoda-ku (JP)

(72) Inventors: Satoshi Tamai, Tokyo (JP); Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 15/034,081

(22) PCT Filed: Jan. 23, 2015

(86) PCT No.: PCT/JP2015/051784
§ 371 (c)(1),
(2) Date: May 3, 2016

(87) PCT Pub. No.: WO2015/111684
PCT Pub. Date: Jul. 30, 2015

(65) Prior Publication Data
US 2016/0281038 A1   Sep. 29, 2016

(30) Foreign Application Priority Data

Jan. 27, 2014   (JP) ................................. 2014-012364

(51) Int. Cl.
*C11D 11/00*   (2006.01)
*C23G 1/06*   (2006.01)
(Continued)

(52) U.S. Cl.
CPC .......... *C11D 11/0047* (2013.01); *C11D 1/006* (2013.01); *C11D 1/29* (2013.01);
(Continued)

(58) Field of Classification Search
CPC ........................... C11D 11/0047; C09K 13/00
See application file for complete search history.

(56) References Cited

U.S. PATENT DOCUMENTS 8,642,526 B2 *  2/2014 Visintin ............ H01L 21/02079
                                                                134/1.3
8,716,209 B2 *  5/2014 Kobayashi ............. C11D 3/042
                                                                134/2

(Continued)

FOREIGN PATENT DOCUMENTS

JP    2003-234307 A    8/2003
JP    2008-285508 A    11/2008
(Continued)

OTHER PUBLICATIONS

International Search Report Issued Apr. 7, 2015 in PCT/JP15/51784 Filed Jan. 23, 2015.

*Primary Examiner* — Gregory Webb
(74) *Attorney, Agent, or Firm* — Oblon, McClelland, Maier & Neustadt, L.L.P.

(57) ABSTRACT

This invention provides a liquid composition that removes titanium nitride from a substrate without corroding tungsten or a low-k interlayer dielectric also present on said substrate. Said liquid composition has a pH between 0 and 4, inclusive, and contains the following: at least one oxidizing agent (A) selected from the group consisting of potassium permanganate, ammonium peroxodisulfate, potassium peroxodisulfate, and sodium peroxodisulfate; a fluorine compound (B); and a tungsten-corrosion preventer (C). The tungsten-corrosion preventer (C) either contains at least two different compounds selected from a group of compounds (C1)

(Continued)

consisting of alkylamines, salts thereof, fluoroalkylamines, salts thereof, and the like or contains at least one compound selected from said group of compounds (C1) and at least one compound selected from a group of compounds (C2) consisting of polyoxyalkylene alkylamines, polyoxyalkylene fluoroalkylamines, and the like. The mass concentration of potassium permanganate in the abovementioned oxidizing agent (A) is between 0.001% and 0.1%, inclusive, and the mass concentration of the abovementioned fluorine compound (B) is between 0.01% and 1%, inclusive.

21 Claims, 1 Drawing Sheet

(51) Int. Cl.

| | | |
|---|---|---|
| *C23G 1/10* | (2006.01) | |
| *H01L 21/02* | (2006.01) | |
| *H01L 21/3213* | (2006.01) | |
| *C11D 3/00* | (2006.01) | |
| *C11D 7/08* | (2006.01) | |
| *C11D 7/10* | (2006.01) | |
| *C11D 7/32* | (2006.01) | |
| *C11D 7/36* | (2006.01) | |
| *H01L 21/768* | (2006.01) | |
| *C11D 3/39* | (2006.01) | |
| *C11D 1/00* | (2006.01) | |
| *C11D 1/29* | (2006.01) | |
| *C11D 1/34* | (2006.01) | |
| *H01L 21/311* | (2006.01) | |

(52) U.S. Cl.
CPC ............ *C11D 1/345* (2013.01); *C11D 3/0073* (2013.01); *C11D 3/3947* (2013.01); *C11D 7/08* (2013.01); *C11D 7/10* (2013.01); *C11D 7/3209* (2013.01); *C11D 7/36* (2013.01); *C23G 1/061* (2013.01); *C23G 1/106* (2013.01); *H01L 21/02063* (2013.01); *H01L 21/32134* (2013.01); *H01L 21/76814* (2013.01); *H01L 21/31144* (2013.01)

(56) References Cited

U.S. PATENT DOCUMENTS

| | | | | |
|---|---|---|---|---|
| 2003/0119691 | A1* | 6/2003 | Smith | C11D 3/042 |
| | | | | 510/254 |
| 2010/0112728 | A1* | 5/2010 | Korzenski | C09K 13/08 |
| | | | | 438/3 |
| 2010/0163788 | A1 | 7/2010 | Visintin et al. | |
| 2011/0275164 | A1* | 11/2011 | Visintin | H01L 21/02079 |
| | | | | 438/4 |
| 2014/0038420 | A1* | 2/2014 | Chen | H01L 21/32134 |
| | | | | 438/754 |
| 2016/0186058 | A1* | 6/2016 | Parris | C09K 13/02 |
| | | | | 216/18 |

FOREIGN PATENT DOCUMENTS

| | | |
|---|---|---|
| JP | 2010-515246 A | 5/2010 |
| WO | 2013/101907 A1 | 7/2013 |

\* cited by examiner

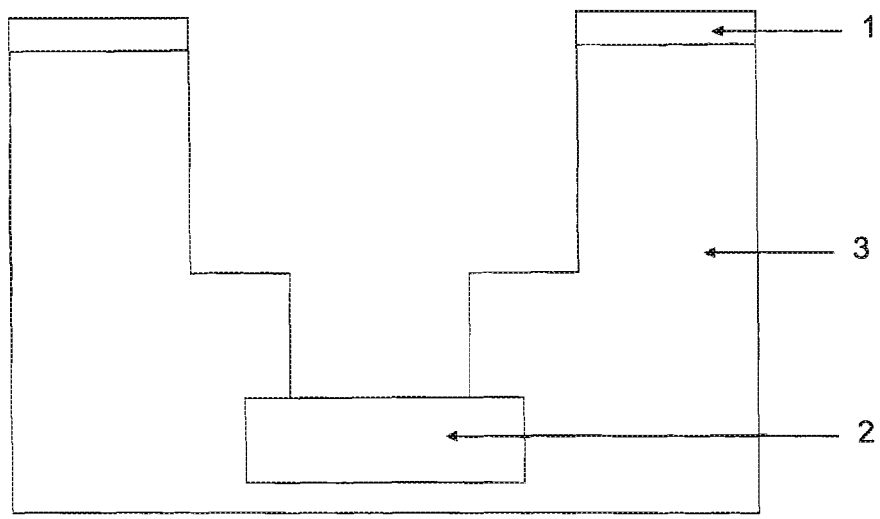

LIQUID COMPOSITION FOR REMOVING TITANIUM NITRIDE, SEMICONDUCTOR-ELEMENT CLEANING METHOD USING SAME, AND SEMICONDUCTOR-ELEMENT MANUFACTURING METHOD

TECHNICAL FIELD

The present invention relates to a liquid composition, and more specifically, relates to: a liquid composition for removing titanium nitride, which is used for a hard mask, without corroding tungsten, which is used for a wiring, or a low-k interlayer dielectric in the production process of a semiconductor device; a method for cleaning a semiconductor device using the same; and a method for producing a semiconductor device.

BACKGROUND ART

When producing a semiconductor substrate, various materials including both organic materials and inorganic materials are used, and tungsten and titanium nitride are included therein. Tungsten is used, for example, as a wiring material. Regarding titanium nitride, recently, methods for using it as a hard mask have been examined.

For example, in the case of a semiconductor substrate in which tungsten coexists with titanium nitride on the surface of the substrate, wherein tungsten is used as a wiring and titanium nitride is used as a hard mask, it is desired to remove titanium nitride without corroding tungsten. Titanium nitride can be relatively easily removed by using a composition containing hydrogen peroxide, but it is difficult to use hydrogen peroxide because it has high tungsten corrosiveness. In addition, it is required to increase the etching selectivity of titanium nitride relative to tungsten.

For this reason, in order to prevent tungsten corrosion due to hydrogen peroxide, methods of adding a corrosion preventer to a composition containing hydrogen peroxide have been examined. Patent Document 1 discloses corrosion preventers obtained by using quaternary ammonium and salts thereof, quaternary pyridinium and salts thereof, quaternary bipyridinium and salts thereof, and quaternary imidazolium and salts thereof. However, the corrosion preventers disclosed in Patent Document 1 do not exert sufficient effects of preventing corrosion of tungsten.

Patent Document 2 describes that titanium nitride can be etched without corroding tungsten by using a concentrated sulfuric acid as a composition not containing hydrogen peroxide. However, in Patent Document 2, the etching rate of titanium nitride is low (3 to 15 Å/min). Therefore, it is not practical, for example, in the case of use for removing a titanium nitride hard mask, which usually has a thickness of several hundred Å to several thousand Å.

Patent Document 3 describes that titanium nitride can be etched without corroding tungsten by using a composition containing an oxidizing agent, a fluorine compound and a corrosion preventer. However, in Patent Document 3, titanium nitride removability is low, and for example, there is a problem that sufficient effects of preventing tungsten corrosion are not obtained thereby.

PRIOR ART DOCUMENTS

Patent Documents

Patent Document 1: Japanese Laid-Open Patent Publication No. 2008-285508

Patent Document 2: Japanese Laid-Open Patent Publication No. 2003-234307

Patent Document 3: International Publication WO2013/101907 pamphlet

SUMMARY OF THE INVENTION

Problems to be Solved by the Invention

One problem to be solved by the present invention is to solve at least one of the above-described conventional problems. Further, another problem to be solved by the present invention is to provide a liquid composition which can remove titanium nitride from a substrate without corroding tungsten or a low-k interlayer dielectric also present on the substrate, a method for cleaning a semiconductor device using the same, and a method for producing a semiconductor device.

Means for Solving the Problems

The present inventors diligently made researches in order to solve the above-described problems, and found that the above-described problems can be solved by using a specific liquid composition containing an oxidizing agent, a fluorine compound and a tungsten-corrosion preventer.

Specifically, the present invention is as follows:

<1> A liquid composition which removes titanium nitride from a substrate without corroding tungsten or a low-k interlayer dielectric also present on said substrate, said liquid composition having a pH of 0 to 4 and comprising:

at least one oxidizing agent (A) selected from the group consisting of potassium permanganate, ammonium peroxodisulfate, potassium peroxodisulfate and sodium peroxodisulfate;

a fluorine compound (B); and a tungsten-corrosion preventer (C), wherein the tungsten-corrosion preventer (C) either contains at least two different compounds selected from a group of compounds (C1) consisting of alkylamines and salts thereof, fluoroalkylamines and salts thereof, alkylamine oxides, fluoroalkylamine oxides, alkyl betaines, fluoroalkyl betaines, alkyl quaternary ammonium and salts thereof, fluoroalkyl quaternary ammonium and salts thereof, alkyl quaternary pyridinium salts, fluoroalkyl quaternary pyridinium salts, alkyl quaternary bipyridinium salts, fluoroalkyl quaternary bipyridinium salts, alkyl quaternary imidazolium salts and fluoroalkyl quaternary imidazolium salts, or contains at least one compound selected from the group of compounds (C1) and at least one compound selected from a group of compounds (C2) consisting of polyoxyalkylene alkylamines, polyoxyalkylene fluoroalkylamines, polyoxyalkylene alkylethers, polyoxyalkylene fluoroalkylethers, polyoxyalkylene alkyl phosphates, polyoxyalkylene fluoroalkyl phosphates, polyoxyalkylene alkylether sulfates, polyoxyalkylene fluoroalkylether sulfates, alkyldiphenyl ether sulfonates and fluoroalkyldiphenyl ether sulfonates, and wherein the concentration of potassium permanganate in the oxidizing agent (A) is 0.001 to 0.1% by mass, and wherein the concentration of the fluorine compound (B) is 0.01 to 1% by mass.

<2> The liquid composition according to item <1>, which does not contain hydrogen peroxide.

<3> The liquid composition according to item <1>, wherein the fluorine compound (B) is at least one compound selected from the group consisting of hydrofluoric acid, ammonium fluoride, acidic ammonium fluoride, tetramethylammonium fluoride, potassium fluoride, hexafluorosilicic acid and tetrafluoroboric acid.

<4> The liquid composition according to item <1>, wherein the alkylamines or fluoroalkylamines in the group of compounds (C1) are represented by general formula (1) below:

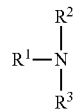

(1)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

<5> The liquid composition according to item <1>, wherein the alkylamine salts or fluoroalkylamine salts in the group of compounds (C1) are at least one compound selected from the group consisting of hydrochlorides, nitrates, acetates, methanesulfonates, chlorates, perchlorates, hydrofluorides, hydrobromates, hydroiodides, hydrogensulfates, sulfates, hydrogencarbonates, carbonates, dihydrogen phosphates, hydrogen phosphates and phosphates.

<6> The liquid composition according to item <1>, wherein the alkylamine oxides or fluoroalkylamine oxides in the group of compounds (C1) are represented by general formula (2) below:

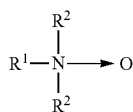

(2)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

<7> The liquid composition according to item <1>, wherein the alkyl betaines or fluoroalkyl betaines in the group of compounds (C1) are represented by general formula (3) or (4) below:

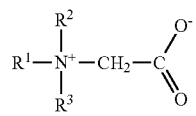

(3)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom;

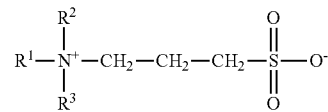

(4)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

<8> The liquid composition according to item <1>, wherein the alkyl quaternary ammonium and salts thereof or fluoroalkyl quaternary ammonium and salts thereof in the group of compounds (C1) are represented by general formula (5), (6) or (7) below:

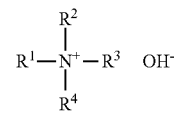

(5)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom;

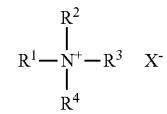

(6)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom; and X represents a halogen atom: F, Cl, Br or I;

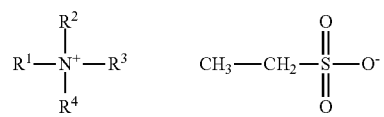

(7)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom.

<9> The liquid composition according to item <1>, wherein the alkyl quaternary pyridinium salts or fluoroalkyl quaternary pyridinium salts in the group of compounds (C1) are represented by general formula (8) below:

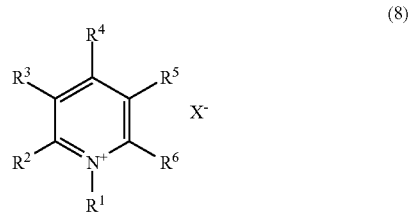

(8)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$, $R^3$, $R^4$, $R^5$ and $R^6$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

<10> The liquid composition according to item <1>, wherein the alkyl quaternary bipyridinium salts or fluoroalkyl quaternary bipyridinium salts in the group of compounds (C1) are represented by general formula (9) below:

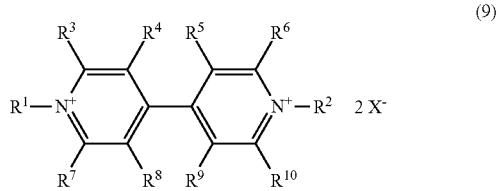

(9)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ to $R^{10}$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

<11> The liquid composition according to item <1>, wherein the alkyl quaternary imidazolium salts or fluoroalkyl quaternary imidazolium salts in the group of compounds (C1) are represented by general formula (10) or (11) below:

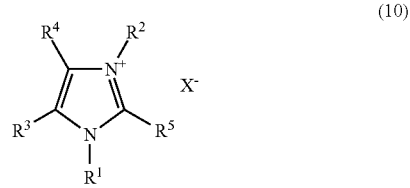

(10)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkyl group having 1 to 4 carbon atoms, and a part or all of hydrogen atoms bound to the alkyl group may be substituted with a fluorine atom; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I;

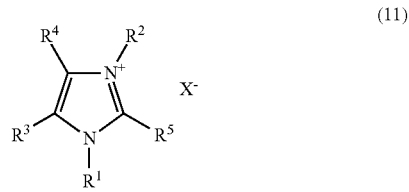

(11)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

<12> The liquid composition according to item <1>, wherein the polyoxyalkylene alkylamines or polyoxyalkylene fluoroalkylamines in the group of compounds (C2) are represented by general formula (12) below:

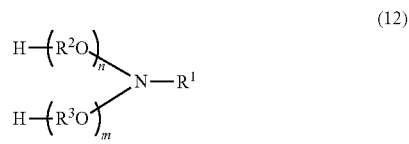

(12)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ and $R^3$ represent an alkanediyl group having 2 to 6 carbon atoms; and m and n represent an integer from 2 to 20, and m and n may be the same or different.

<13> The liquid composition according to item <1>, wherein the polyoxyalkylene alkylethers or polyoxyalkylene fluoroalkylethers in the group of compounds (C2) are represented by general formula (13) below:

(13)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkanediyl group having 2 to 6 carbon atoms; and n represents an integer from 2 to 20.

<14> The liquid composition according to item <1>, wherein the polyoxyalkylene alkyl phosphates or polyoxyalkylene fluoroalkyl phosphates in the group of compounds (C2) are represented by general formula (14) or (15) below:

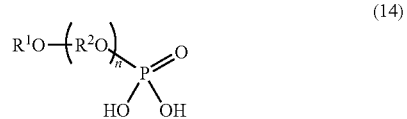

(14)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkanediyl group having 2 to 6 carbon atoms; and n represents an integer from 2 to 20;

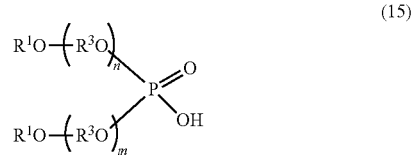

(15)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ and $R^4$ represent an alkanediyl group having 2 to 6 carbon atoms; and m and n represent an integer from 2 to 20, and m and n may be the same or different.

<15> The liquid composition according to item <1>, wherein the polyoxyalkylene alkylether sulfates or polyoxyalkylene fluoroalkylether sulfates in the group of compounds (C2) are represented by general formula (16) below:

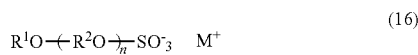

(16)

wherein: $R^1$ represents an alkyl group having 8 to 18 carbon atoms, an alkenyl group having 8 to 18 carbon atoms, a phenyl group or a benzyl group, and a part or all of hydrogen atoms bound to the alkyl group or alkenyl group may be substituted with a fluorine atom; $R^2$ represents an alkanediyl group having 2 to 6 carbon atoms; n represents a number from 2 to 20; and M represents sodium (Na), potassium (K) or ammonium ($NH_4$).

<16> The liquid composition according to item <1>, wherein the alkyldiphenyl ether sulfonates or fluoroalkyldiphenyl ether sulfonates in the group of compounds (C2) are represented by general formula (17) below:

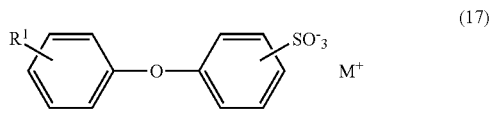

(17)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and M represents sodium (Na), potassium (K) or ammonium ($NH_4$).

<17> The liquid composition according to item <1>, wherein the concentration of ammonium peroxodisulfate, potassium peroxodisulfate or sodium peroxodisulfate in the oxidizing agent (A) is 0.1 to 20% by mass.

<18> The liquid composition according to item <1>, wherein the concentration of the tungsten-corrosion preventer (C) is 0.002 to 2% by mass.

<19> The liquid composition according to item <1>, wherein the concentration of the compound C1 is 0.001 to 1% by mass and the concentration of the compound C2 is 0.001 to 1% by mass.

<20> A method for cleaning a semiconductor device using the liquid composition according to any one of items <1> to <19>.

<21> A method for producing a semiconductor device, in which titanium nitride is removed from a substrate without corroding tungsten or a low-k interlayer dielectric also present on said substrate, said method comprising bringing the substrate having titanium nitride, tungsten and the low-k interlayer dielectric into contact with the liquid composition according to any one of items <1> to <19>.

Advantageous Effect of the Invention

The liquid composition of the present invention can remove titanium nitride from a substrate without corroding tungsten or a low-k interlayer dielectric also present on the substrate.

BRIEF DESCRIPTION OF THE DRAWINGS

FIG. 1 is a schematic diagram showing a cross-sectional surface of a semiconductor device comprising a titanium nitride hard mask 1, a tungsten wiring 2 and a low-k interlayer dielectric 3.

EMBODIMENTS FOR CARRYING OUT THE INVENTION

Hereinafter, the present invention will be described in detail.

<Liquid Composition>

The liquid composition of the present invention is used for removing titanium nitride from a substrate without corroding tungsten or a low-k interlayer dielectric also present on the substrate, and the liquid composition comprises an oxidizing agent (A), a fluorine compound (B) and a tungsten-corrosion preventer (C) and has a pH of 0 to 4.

Oxidizing Agent (A)

The oxidizing agent contained in the liquid composition of the present invention (hereinafter sometimes referred to as just "the component (A)") functions as an oxidizing agent for titanium nitride. One of features of the liquid composition of the present invention is that it does not contain hydrogen peroxide. Since the liquid composition of the present invention does not contain hydrogen peroxide, there is no problem of tungsten corrosion. Preferred examples of the oxidizing agent include potassium permanganate, ammonium peroxodisulfate, potassium peroxodisulfate and sodium peroxodisulfate. These oxidizing agents may be used solely, or two or more of them may be used in combination.

The content of potassium permanganate that is the component (A) in the liquid composition of the present invention is preferably 0.001% by mass to 0.1% by mass, more preferably 0.005% by mass to 0.1% by mass, and particularly preferably 0.005% by mass to 0.05% by mass. When the content of potassium permanganate (component (A)) in the liquid composition of the present invention is within the above-described range, titanium nitride removability is high, and tungsten and the low-k interlayer dielectric are not corroded. The higher the concentration of potassium permanganate is, the higher the titanium nitride removability is, but in this case, tungsten corrosiveness is increased. For this reason, when the concentration of potassium permanganate is too high, it is not preferred.

The content of ammonium peroxodisulfate, potassium peroxodisulfate and sodium peroxodisulfate that are the component (A) in the liquid composition of the present invention is preferably 0.1% by mass to 20% by mass, more preferably 0.1% by mass to 10% by mass, and particularly preferably 0.5% by mass to 10% by mass. When the content of ammonium peroxodisulfate, potassium peroxodisulfate and sodium peroxodisulfate in the liquid composition of the present invention is within the above-described range, titanium nitride removability is high, and tungsten and the low-k interlayer dielectric are not corroded. The higher the concentration of peroxodisulfate ion is, the higher the titanium nitride removability is, but in this case, tungsten corrosiveness is increased. For this reason, when the concentration of peroxodisulfate ion is too high, it is not preferred.

Fluorine Compound (B)

The fluorine compound contained in the liquid composition of the present invention (hereinafter sometimes referred to as just "the component (B)") has a function of etching titanium nitride. The fluorine compound is selected from compounds having a fluorine atom. Preferred examples of the fluorine compound include hydrofluoric acid, ammonium fluoride, acidic ammonium fluoride, tetramethylammonium fluoride, potassium fluoride, hexafluorosilicic acid, ammonium hexafluorosilicate, tetrafluoroboric acid and ammonium tetrafluoroborate. These fluorine compounds may be used solely, or two or more of them may be used in combination. Among them, hydrofluoric acid, ammonium fluoride, acidic ammonium fluoride, tetramethylammonium fluoride and potassium fluoride are more preferred. Particularly preferred are hydrofluoric acid, ammonium fluoride and acidic ammonium fluoride.

The content of the fluorine compound that is the component (B) in the liquid composition of the present invention is preferably 0.01 to 1% by mass, more preferably 0.05 to 1% by mass, and particularly preferably 0.05 to 0.5% by mass. When the content of the fluorine compound in the liquid composition of the present invention is within the above-described range, titanium nitride removability is high, and tungsten and the low-k interlayer dielectric are not corroded. The higher the concentration of the fluorine compound is, the higher the titanium nitride removability is, but in this case, corrosiveness of tungsten and the low-k interlayer dielectric is increased. For this reason, when the concentration of the fluorine compound is too high, it is not preferred.

Tungsten-Corrosion Preventer (C)

The tungsten-corrosion preventer contained in the liquid composition of the present invention (hereinafter sometimes referred to as just "the component (C)") contains at least two different compounds selected from a group of compounds (C1), or contains at least one compound selected from the group of compounds (C1) and at least one compound selected from a group of compounds (C2), and accordingly has a function of preventing tungsten corrosion.

Examples of compounds included in the group of compounds (C1) (hereinafter, each of the compounds is sometimes referred to as "the component (C1)") include alkylamines and salts thereof, fluoroalkylamines and salts thereof, alkylamine oxides, fluoroalkylamine oxides, alkyl betaines, fluoroalkyl betaines, alkyl quaternary ammonium and salts thereof, fluoroalkyl quaternary ammonium and salts thereof, alkyl quaternary pyridinium salts, fluoroalkyl quaternary pyridinium salts, alkyl quaternary bipyridinium salts, fluoroalkyl quaternary bipyridinium salts, alkyl quaternary imidazolium salts and fluoroalkyl quaternary imidazolium salts.

The alkylamines or fluoroalkylamines (C1) are preferably represented by general formula (1) below:

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

The alkylamine salts or fluoroalkylamine salts (C1) are at least one compound selected from the group consisting of hydrochlorides, nitrates, acetates, methanesulfonates, chlorates, perchlorates, hydrofluorides, hydrobromates, hydroiodides, hydrogensulfates, sulfates, hydrogencarbonates, carbonates, dihydrogen phosphates, hydrogen phosphates and phosphates.

Specific examples of the alkylamines and salts thereof or fluoroalkylamines and salts thereof include octylamine, decylamine, dodecylamine, tetradecylamine, hexadecylamine, octadecylamine, dodecylamine hydrochloride, perfluorododecylamine, dioctylamine, didecylamine, didodecylamine, trioctylamine, tridecylamine, tridodecylamine, octyldimethylamine, decyldimethylamine and dodecyldimethylamine. Among them, dodecylamine, tetradecylamine and hexadecylamine are preferred.

The alkylamine oxides or fluoroalkylamine oxides (C1) are preferably represented by general formula (2) below:

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

Specific examples of the alkylamine oxides or fluoroalkylamine oxides include N-decyl-N,N-dimethylamine oxide, N-dodecyl-N,N-dimethylamine oxide, N-tetradecyl-N,N-dimethylamine oxide, N-hexadecyl-N,N-dimethylamine oxide, Surflon S-241 (trade name, perfluoroalkylamine oxide manufactured by AGC Seimi Chemical Co., Ltd.) and AMOGEN (trade name, alkylamine oxide manufactured by DKS Co. Ltd.). Among them, Surflon S-241 is preferred.

The alkyl betaines or fluoroalkyl betaines (C1) are preferably represented by general formula (3) or (4) below:

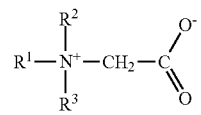
(3)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom;

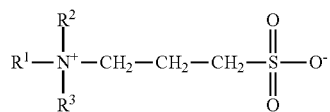
(4)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

Specific examples of the alkyl betaines or fluoroalkyl betaines include dodecyldimethylaminoacetic acid betaine, perfluorododecyldimethylaminoacetic acid betaine, dodecyldimethylamino sulfobetaine, perfluorododecyldimethylamino sulfobetaine and AMPHITOL (trade name, alkyl betaine manufactured by DKS Co. Ltd.). Among them, AMPHITOL 20YB and AMPHITOL 24B are preferred.

The alkyl quaternary ammonium and salts thereof or fluoroalkyl quaternary ammonium and salts thereof (C1) are preferably represented by general formula (5), (6) or (7) below:

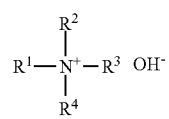
(5)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom;

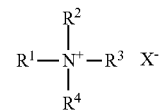
(6)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom; and X represents a halogen atom: F, Cl, Br or I;

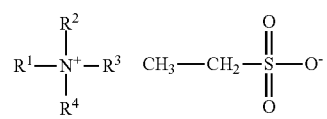
(7)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom.

Specific examples of the alkyl quaternary ammonium and salts thereof or fluoroalkyl quaternary ammonium and salts thereof include dodecyltrimethylammonium hydroxide, tetradecyltrimethylammonium hydroxide, hexadecyltrimethylammonium hydroxide, benzyldimethyldecylammonium hydroxide, benzyldimethyldodecylammonium hydroxide, benzyldimethyltetradecylammonium hydroxide, benzyldimethylhexadecylammonium hydroxide, dodecyl trimethylammonium hydroxide, tetradecyltrimethylammonium hydroxide, hexadecyltrimethylammonium hydroxide, dodecyltrimethylammonium chloride, tetradecyltrimethylammonium chloride, hexadecyltrimethylammonium chloride, benzyldimethyldecylammonium chloride, benzyldimethyldodecylammonium chloride, benzyldimethyltetradecylammonium chloride, benzyldimethylhexadecylammonium chloride, ETHOQUAD (trade name, polyoxyethylene-addition quaternary ammonium chloride manufactured by Lion Corporation), and FLUORAD FC-135 (trade name, perfluoroalkyl quaternary ammonium iodide manufactured by Sumitomo 3M Ltd.), QUARTAMIN (trade name, alkyl quaternary ammonium chloride manufactured by Kao Corporation), CATIOGEN (trade name, alkyl quaternary ammonium ethylsulfate manufactured by DKS Co. Ltd.), etc. Among them, dodecyltrimethylammonium chloride, hexadecyltrimethylammonium chloride and FLUORAD FC-135 are preferred.

The alkyl quaternary pyridinium salts or fluoroalkyl quaternary pyridinium salts (C1) are preferably represented by general formula (8) below:

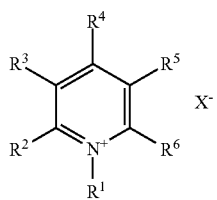

(8)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$, $R^3$, $R^4$, $R^5$ and $R^6$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

Specific examples of the alkyl quaternary pyridinium salts or fluoroalkyl quaternary pyridinium salts (C1) include 1-decylpyridinium chloride, 1-dodecylpyridinium chloride, 1-tetradecylpyridinium chloride, 1-hexadecylpyridinium chloride and 1-hexadecyl-4-methylpyridinium chloride. Among them, 1-dodecylpyridinium chloride and 1-hexadecyl-4-methylpyridinium chloride are preferred.

The alkyl quaternary bipyridinium salts or fluoroalkyl quaternary bipyridinium salts (C1) are preferably represented by general formula (9) below:

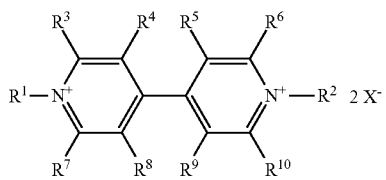

(9)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ to $R^{10}$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

Specific examples of the alkyl quaternary bipyridinium salts or fluoroalkyl quaternary bipyridinium salts include 1,1'-di-n-octyl-4,4'-bipyridinium dibromide, 1-methyl-1'-tetradecyl-4,4'-bipyridinium dibromide and 1,1'-di-n-perfluorooctyl-4,4'-bipyridinium dibromide. Among them, 1,1'-di-n-octyl-4,4'-bipyridinium dibromide is preferred.

The alkyl quaternary imidazolium salts or fluoroalkyl quaternary imidazolium salts (C1) are preferably represented by general formula (10) or (11) below:

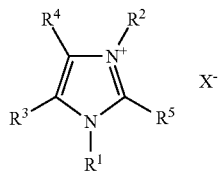

(10)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkyl group having 1 to 4 carbon atoms; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I;

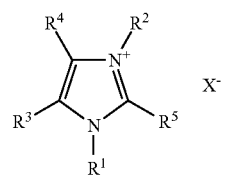

(11)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

Specific examples of the alkyl quaternary imidazolium salts or fluoroalkyl quaternary imidazolium salts include 1-octyl-3-methylimidazolium chloride, 1-decyl-3-methylimidazolium chloride, 1-dodecyl-3-methylimidazolium chloride, 1-tetradecyl-3-methylimidazolium chloride, 1-hexadecyl-3-methylimidazolium chloride, 1-octadecyl-3-methylimidazolium chloride, 1,3-didecyl-2-methylimidazolium chloride and 1-perfluorooctylimidazolium chloride. Among them, 1-dodecyl-3-methylimidazolium chloride, 1-tetradecyl-3-methylimidazolium chloride, 1-hexadecyl-3-methylimidazolium chloride, 1-octadecyl-3-methylimidazolium chloride and 1,3-didecyl-2-methylimidazolium chloride are preferred.

Examples of compounds included in the group of compounds (C2) (hereinafter, each of the compounds is sometimes referred to as "the component (C2)") include polyoxyalkylene alkylamines, polyoxyalkylene fluoroalkylamines, polyoxyalkylene alkylethers, polyoxyalkylene fluoroalkylethers, polyoxyalkylene alkyl phosphates, polyoxyalkylene fluoroalkyl phosphates, polyoxyalkylene alkylether sulfates, polyoxyalkylene fluoroalkylether sulfates, alkyldiphenyl ether sulfonates and fluoroalkyldiphenyl ether sulfonates.

The polyoxyalkylene alkylamines or polyoxyalkylene fluoroalkylamines (C2) are preferably represented by general formula (12) below:

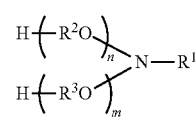

(12)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ and $R^3$ represent an alkanediyl group having 2 to 6 carbon atoms; and m and n represent an integer from 2 to 20, and m and n may be the same or different.

Specific examples of the polyoxyalkylene alkylamines or polyoxyalkylene fluoroalkylamines include Nymeen (trade name, polyoxyethylene alkylamine manufactured by Nippon Oil & Fats Co., Ltd.) and NOIGEN (trade name, polyoxyethylene alkylamine manufactured by DKS Co. Ltd.). Among them, Nymeen F-215, NOIGEN ET-189 and NOIGEN XL-140 are preferred.

The polyoxyalkylene alkylethers or polyoxyalkylene fluoroalkylethers (C2) are preferably represented by general formula (13) below:

(13)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkanediyl group having 2 to 6 carbon atoms; and n represents an integer from 2 to 20.

Specific examples of the polyoxyalkylene alkylethers or polyoxyalkylene fluoroalkylethers include Newcol (trade name, alkylether-type nonionic surfactant manufactured by Nippon Nyukazai Co., Ltd.), Ftergent (trade name, polyoxyethylene perfluoroalkylether manufactured by Neos Company Limited) and ANTI-FROTH (trade name, special nonionic surfactant manufactured by DKS Co. Ltd.). Among them, Newcol 2308-LY, ANTI-FROTH M-9, Ftergent 222F, Ftergent 250 and Ftergent 251 are preferred.

The polyoxyalkylene alkyl phosphates or polyoxyalkylene fluoroalkyl phosphates (C2) are preferably represented by general formula (14) or (15) below:

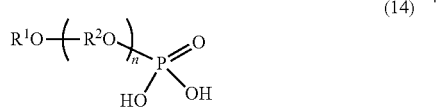

(14)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkanediyl group having 2 to 6 carbon atoms; and n represents an integer from 2 to 20;

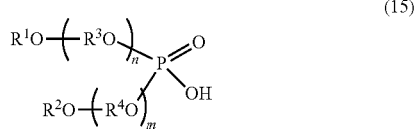

(15)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ and $R^4$ represent an alkanediyl group having 2 to 6 carbon atoms; and m and n represent an integer from 2 to 20, and m and n may be the same or different.

Specific examples of the polyoxyalkylene alkyl phosphates or polyoxyalkylene fluoroalkyl phosphates include Phosphanol (trade name, polyoxyethylene phosphate manufactured by TOHO Chemical Industry Co., Ltd.). Among them, Phosphanol RA-600, Phosphanol RS-710, Phosphanol RL-310, Phosphanol ED-230, Phosphanol iD 10-P, Phosphanol ML-240 and Phosphanol OF-100 are preferred.

The polyoxyalkylene alkylether sulfates or polyoxyalkylene fluoroalkylether sulfates (C2) are preferably represented by general formula (16) below:

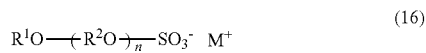

(16)

wherein: $R^1$ represents an alkyl group having 8 to 18 carbon atoms, an alkenyl group having 8 to 18 carbon atoms, a phenyl group or a benzyl group, and a part or all of hydrogen atoms bound to the alkyl group or alkenyl group may be substituted with a fluorine atom; $R^2$ represents an alkanediyl group having 2 to 6 carbon atoms; n represents an integer from 2 to 20; and M represents sodium (Na), potassium (K) or ammonium ($NH_4$).

Specific examples of the polyoxyalkylene alkylether sulfates or polyoxyalkylene fluoroalkylether sulfates include HITENOL (trade name, polyoxyethylene alkylether sulfonic acid manufactured by DKS Co. Ltd.). Among them, HITENOL NF-08, HITENOL NF-13 and HITENOL NF-17 are preferred.

The alkyldiphenyl ether sulfonates or fluoroalkyldiphenyl ether sulfonates (C2) are preferably represented by general formula (17) below:

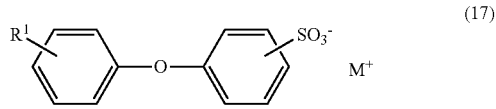

(17)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and M represents sodium (Na), potassium (K) or ammonium ($NH_4$).

Specific examples of the alkyldiphenyl ether sulfonates or fluoroalkyldiphenyl ether sulfonates include PELEX (trade name, alkyldiphenyl ether disulfonate manufactured by Kao Corporation). Among them, PELEX SS-H and PELEX SS-L are preferred.

The content of the tungsten-corrosion preventer (component (C)) in the liquid composition of the present invention is preferably 0.002 to 2% by mass, more preferably 0.004 to 1.0% by mass, and particularly preferably 0.01 to 0.4% by mass. When the content of the component (C) in the liquid composition of the present invention is within the above-described range, sufficient performance of preventing tungsten corrosion can be obtained. When the concentration of the tungsten-corrosion preventer is less than 0.002% by weight, sufficient performance of preventing corrosion may not be obtained, and when the concentration is more than 2% by mass, it is uneconomical and unpractical.

The content of the component (C1) that is the tungsten-corrosion preventer in the liquid composition of the present invention is preferably 0.001 to 1% by mass, more preferably 0.002 to 0.5% by mass, and particularly preferably 0.005 to 0.2% by mass. When the content of the component (C1) in the liquid composition of the present invention is within the above-described range, sufficient performance of preventing tungsten corrosion can be obtained. When the concentration of the tungsten-corrosion preventer is less than 0.001% by weight, sufficient performance of preventing corrosion may not be obtained, and when the concentration is more than 1% by mass, it is uneconomical and unpractical.

The content of the component (C2) that is the tungsten-corrosion preventer in the liquid composition of the present invention is preferably 0.001 to 1% by mass, more preferably 0.001 to 0.5% by mass, and particularly preferably 0.005 to 0.2% by mass. When the content of the component (C2) in the liquid composition of the present invention is within the above-described range, sufficient performance of preventing tungsten corrosion can be obtained. When the concentration of the tungsten-corrosion preventer is less than 0.001% by weight, sufficient performance of preventing corrosion may not be obtained, and when the concentration is more than 1% by mass, it is uneconomical and unpractical.

pH Adjuster (D)

The pH value of the liquid composition of the present invention is preferably 0 to 4, more preferably 0.5 to 3.5, and particularly preferably 1 to 3.

The pH adjuster (sometimes referred to as "the component (D)") for adjusting the pH value is not particularly limited as long as it can adjust pH, and examples thereof include mineral acids and organic acids such as hydrochloric acid, nitric acid, sulfuric acid, phosphoric acid, perchloric acid and acetic acid, and inorganic and organic base compounds such as ammonia, potassium hydroxide, sodium hydroxide and tetramethylammonium hydroxide. These acids or base compounds may be used solely, or two or more of them may be used in combination. Among them, nitric acid, sulfuric acid, phosphoric acid, acetic acid, ammonia, potassium hydroxide and tetramethylammonium hydroxide are particularly preferred.

The content of the pH adjuster in the liquid composition of the present invention is suitably determined based on the contents of other components so that a desired pH value of the liquid composition can be obtained.

In addition to the above-described component (A), component (B), component (C) and pH adjuster that is contained according to need, the liquid composition of the present invention can contain water, and other various water-soluble organic solvents and additives usually used in liquid compositions for cleaning within a range in which the effects of the liquid composition are not reduced. For example, regarding water, preferred is water from which metal ions, organic impurities, particles, etc. have been removed by any of distillation, ion exchange treatment, filtering, various adsorption treatments, etc. More preferred is pure water, and particularly preferred is ultrapure water.

The water-soluble organic solvent is not particularly limited as long as the effects of the liquid composition are not reduced. For example, ethylene glycols such as diethylene glycol monomethyl ether, diethylene glycol monoethyl ether, diethylene glycol monobutyl ether and dipropylene glycol monomethyl ether; alcohols such as methanol, ethanol, 1-propanol, 2-propanol, 1-butanol and t-butanol; ethylene glycol, propylene glycol, glycerin, etc. can be suitably used.

<Method for Producing a Semiconductor Device>

The method for producing a semiconductor device according to the present invention is a method for producing a semiconductor device, in which titanium nitride is removed from a substrate without corroding tungsten or a low-k interlayer dielectric also included in the substrate, comprising bringing the substrate including titanium nitride, tungsten and the low-k interlayer dielectric into contact with the above-described liquid composition. According to the method of the present invention, titanium nitride can be removed from the substrate without corroding tungsten or the low-k interlayer dielectric also included in the substrate.

The method for producing a semiconductor device according to the present invention targets a substrate including titanium nitride, tungsten and a low-k interlayer dielectric. Regarding a product to be cleaned, for example, a tungsten wiring, a low-k interlayer dielectric, a titanium nitride hard mask and a photoresist are laminated on a substrate such as a silicon wafer, then the selective exposure/development treatment is applied to the photoresist to form a photoresist pattern, and then the dry-etching treatment is applied to the titanium nitride hard mask and the low-k interlayer dielectric using the resist pattern as a mask and the photoresist is removed, thereby obtaining the product to be cleaned.

The method for bringing the product to be cleaned into contact with the liquid composition is not particularly limited. For example, it is possible to employ a method of bringing a target product into contact with a liquid composition by means of dropping of the liquid composition (single wafer spin process), spray or the like, a method of immersing a product to be etched in a liquid composition, and the like. In the present invention, cleaning can be carried out by any of such methods.

<Method for Cleaning a Semiconductor Device>

The temperature for use of the liquid composition of the present invention is preferably 10 to 70° C., and particularly preferably 20 to 60° C. When the temperature of the liquid composition is 10° C. or higher, excellent production efficiency can be obtained because a good etching rate is obtained. Meanwhile, when the temperature is 70° C. or lower, composition change of the liquid is suppressed and constant etching conditions can be maintained. Though the etching rate is increased by raising the temperature of the liquid composition, an optimum treatment temperature may be suitably determined in consideration of suppression of composition change of the liquid composition and the like.

EXAMPLES

Hereinafter, the present invention will be described in more detail based on Examples, but the scope of the present invention is not limited by the Examples.

<Evaluation of Titanium Nitride Removability and Performance of Preventing Corrosion of Tungsten and Low-k Interlayer Dielectric>

Titanium nitride removability, performance of preventing tungsten corrosion and performance of preventing low-k interlayer dielectric corrosion were evaluated by SEM observation. The cross-sectional surface of a substrate after contact with a liquid composition obtained in each of the Examples and Comparative examples was observed at an accelerating voltage of 2 kV and an emission current of 7 µA using a scanning electron microscope ("SU9000 (model number)"; Hitachi High-Tech Fielding Corporation). Based on SEM images obtained, removability of a titanium nitride hard mask, performance of preventing corrosion of a tungsten wiring and performance of preventing corrosion of a low-k interlayer dielectric were evaluated.

In each case, E and G are regarded as acceptable.

Judgment:

I. Removability of Titanium Nitride Hard Mask 1
E: The titanium nitride hard mask was completely removed.
G: The titanium nitride hard mask was almost removed.
P: The titanium nitride hard mask was not removed.

II. Performance of Preventing Corrosion of Tungsten Wiring 2
E: The tungsten wiring showed no change compared to that prior to cleaning.
G: There was a slightly rough portion on the surface of the tungsten wiring.
P: Corrosion of the tungsten wiring was observed.

III. Performance of Preventing Corrosion of Low-k Interlayer Dielectric 3
E: The low-k interlayer dielectric showed no change compared to that prior to cleaning.
G: There was a slightly concave portion on the surface of the low-k interlayer dielectric.
P: Corrosion of the low-k interlayer dielectric was observed.

Example 1

8.53 kg of pure water, 1.0 kg of 0.02 mol/L potassium permanganate solution (manufactured by Wako Pure Chemical Industries, Ltd., special grade, molecular weight: 158.03) as the component (A), 0.0375 kg of 40% by mass solution of ammonium fluoride (manufactured by Morita Chemical Industries Co., Ltd., semiconductor grade, molecular weight: 37.04) as the component (B), 0.0033 kg of Surflon S-241 (30% by mass product, trade name, perfluoroalkylamine oxide manufactured by AGC Seimi Chemical Co., Ltd.) as the component (C1), 0.001 kg of Phosphanol RS-710 (trade name, polyoxyethylene phosphate manufactured by TOHO Chemical Industry Co., Ltd.) as the component (C2), and 0.426 kg of 47% by mass of sulfuric acid (manufactured by Wako Pure Chemical Industries, Ltd., special grade, molecular weight: 98.08) as the component (D) were put into a polypropylene container (volume: 10 L). The mixture was stirred, dissolution of the components was confirmed, and thus a liquid composition was prepared. The pH value of the obtained liquid composition was 1.4 (Table 1).

A semiconductor device having a wiring structure whose cross-sectional surface is as shown in FIG. 1 was immersed in the liquid composition obtained in the above-described manner at 50° C. for 5 minutes, then rinsed with ultrapure water, and dried by dry nitrogen gas jet. The substrate including titanium nitride, tungsten and a low-k interlayer dielectric after subjected to the cleaning treatment was cut, and the cross-sectional surface of the substrate was observed by SEM to evaluate removability of the titanium nitride hard mask 1 and performance of preventing corrosion of the tungsten wiring 2 and the low-k interlayer dielectric 3. Titanium nitride was completely removed, and corrosion of tungsten and corrosion of the low-k interlayer dielectric were not observed (Table 1).

Examples 2-41

The cleaning treatment was carried out in a manner similar to that in Example 1, except that liquid compositions with blending amounts shown in Tables 1 to 7 were prepared. The evaluation results are shown in Tables 1 to 7. The cross-sectional surface of the substrate after subjected to the cleaning treatment was observed by SEM. Regarding all the respective substrates after subjected to the cleaning treatment with the respective liquid compositions, titanium nitride was completely removed, and corrosion of tungsten and corrosion of the low-k interlayer dielectric were not observed.

Comparative Examples 1-10

The cleaning treatment was carried out in a manner similar to that in Example 1, except that liquid compositions with blending amounts shown in Tables 8 to 9 were prepared. The evaluation results are shown in Tables 8 to 9. The cross-sectional surface of the substrate after subjected to the cleaning treatment was observed by SEM. There was no liquid composition which satisfied all of titanium nitride removability, performance of preventing corrosion of tungsten and performance of preventing corrosion of the low-k interlayer dielectric.

Comparative Example 11

The cleaning treatment was carried out in a manner similar to that in Example 1, except that ammonium iodate as an oxidizing agent, hexafluorosilicic acid as an etching agent, and 5-phenyl-1H-tetrazole and myristyltrimethylammonium bromide as corrosion preventers were blended with blending amounts shown in Table 10. The evaluation results are shown in Table 10. When the cross-sectional surface of the substrate after subjected to the cleaning treatment was observed by SEM, titanium nitride removability was insufficient.

TABLE 1

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 1 | 0.032 | 0.15 | (C1) Surflon S-241: 0.01 (C2) Phosphanol RS-710: 0.01 | 2.0 | 1.4 | E | E | E |
| Example 2 | 0.032 | 0.15 | (C1) Surflon S-241: 0.01 (C2) Phosphanol RA-600: 0.01 | 2.0 | 1.4 | E | E | E |
| Example 3 | 0.032 | 0.15 | (C1) Surflon S-241: 0.01 (C2) Ftergent 250: 0.01 | 2.0 | 1.4 | E | E | E |
| Example 4 | 0.032 | 0.15 | (C1) Surflon S-241: 0.01 (C2) Ftergent 251: 0.01 | 2.0 | 1.4 | E | E | E |
| Example 5 | 0.032 | 0.15 | (C1) Surflon S-241: 0.01 (C2) Ftergent 222F: 0.01 | 2.0 | 1.4 | E | E | E |
| Example 6 | 0.032 | 0.15 | (C1) Surflon S-241: 0.01 (C2) NOIGEN ET-189: 0.01 | 2.0 | 1.4 | E | E | E |

TABLE 1-continued

Table 1

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 7 | 0.032 | 0.15 | (C1) Surflon S-241: 0.01<br>(C2) NOIGEN XL-100: 0.01 | 2.0 | 1.4 | E | E | E |
| Example 8 | 0.032 | 0.15 | (C1) Surflon S-241: 0.01<br>(C2) Nymeen F-215: 0.01 | 2.0 | 1.4 | E | E | E |
| Example 9 | 0.032 | 0.15 | (C1) Surflon S-241: 0.01<br>(C2) Newcol 2308-LY: 0.01 | 2.0 | 1.4 | E | E | E |
| Example 10 | 0.032 | 0.15 | (C1) Surflon S-241: 0.01<br>(C2) HITENOL NF-13: 0.01 | 2.0 | 1.4 | E | E | E |
| Example 11 | 0.032 | 0.15 | (C1) Surflon S-241: 0.01<br>(C2) PELEX SS-H: 0.01 | 2.0 | 1.4 | E | E | E |

Surflon S-241 (manufactured by AGC Seimi Chemical Co., Ltd.) . . . perfluoroalkylamine oxide
Phosphanol RS-710 (manufactured by TOHO Chemical Industry Co., Ltd.) . . . polyoxyethylene alkyl phosphate
Ftergent 250 (manufactured by Neos Company Limited) . . . polyoxyethylene (n = 22) perfluoroalkylether
Ftergent 251 (manufactured by Neos Company Limited) . . . polyoxyethylene (n = 8)perfluoroalkylether
Ftergent 222F (manufactured by Neos Company Limited) . . . polyoxyethylene (n = 22) perfluoroalkylether
NOIGEN ET-189 (manufactured by DKS Co. Ltd.) . . . polyoxyethylene (n = 18) oleylcetyl ether
NOIGEN XL-100 (manufactured by DKS Co. Ltd.) . . . polyoxyalkylene branched decyl ether
Nymeen F-215 (manufactured by Nippon Oil & Fats Co., Ltd.) . . . polyoxyethylene cocoalkyl amine
Newcol 2308-LY (manufactured by Nippon Nyukazai Co., Ltd.) . . . polyoxyalkylene ether
HITENOL NF-13 (manufactured by DKS Co. Ltd.) . . . polyoxyethylene styrenated phenyl ether ammonium sulfate
PELEX SS-H (manufactured by Kao Corporation) . . . dodecyl diphenyl ether disodium sulfonate

TABLE 2

Table 2

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 12 | 0.032 | 0.15 | (C1) dodecylamine: 0.01<br>(C2) Phosphanol RS-710: 0.01 | 2.0 | 1.4 | E | E | E |
| Example 13 | 0.032 | 0.15 | (C1) dodecyltrimethylammonium chloride: 0.01<br>(C2) Phosphanol RS-710: 0.01 | 2.0 | 1.4 | E | E | E |
| Example 14 | 0.032 | 0.15 | (C1) hexadecyltrimethylammonium hydroxide: 0.01<br>(C2) Phosphanol RS-710: 0.01 | 2.0 | 1.4 | E | E | E |
| Example 15 | 0.032 | 0.15 | (C1) 1-dodecylpyridinium chloride: 0.01<br>(C2) Phosphanol RS-710: 0.01 | 2.0 | 1.4 | E | E | E |
| Example 16 | 0.032 | 0.15 | (C1) 1-hexadecylpyridinium chloride: 0.01<br>(C2) Phosphanol RS-710: 0.01 | 2.0 | 1.4 | E | E | E |
| Example 17 | 0.032 | 0.15 | (C1) 1-dodecyl-3-methylimidazolium chloride: 0.01<br>(C2) Phosphanol RS-710: 0.01 | 2.0 | 1.4 | E | E | E |
| Example 18 | 0.032 | 0.15 | (C1) Surflon S-231: 0.01<br>(C2) Phosphanol RS-710: 0.01 | 2.0 | 1.4 | E | E | E |
| Example 19 | 0.032 | 0.15 | (C1) AMOGEN AOL: 0.01<br>(C2) Phosphanol RS-710: 0.01 | 2.0 | 1.4 | E | E | E |
| Example 20 | 0.016 | 0.15 | (C1) AMPHITOL 24B: 0.005<br>(C2) Phosphanol RS-710: 0.005 | 2.0 | 1.4 | E | E | E |

Surflon S-231 (manufactured by AGC Seimi Chemical Co., Ltd.) . . . perfluoroalkyltrialkyl ammonium salt
AMOGEN AOL (manufactured by DKS Co. Ltd.) . . . lauryldimethylamine oxide
AMPHITOL 24B (manufactured by DKS Co. Ltd.) . . . lauryl betaine

TABLE 3

Table 3

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 21 | 0.032 | 0.15 | (C1) dodecyltrimethylammonium chloride: 0.01<br>(C2) Nymeen F-215: 0.01 | 2.0 | 1.4 | E | E | E |
| Example 22 | 0.032 | 0.15 | (C1) 1-dodecyl-3-methylimidazolium chloride: 0.01<br>(C2) Ftergent 250: 0.01 | 2.0 | 1.4 | E | E | E |
| Example 23 | 0.032 | 0.15 | (C1) Surflon S-241: 0.01<br>(C1) QUARTAMIN 24P: 0.01 | 2.0 | 1.4 | E | E | E |

TABLE 3-continued

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 24 | 0.016 | 0.15 | (C1) Surflon S-241: 0.01 (C1) QUARTAMIN 86W: 0.01 | 2.0 | 1.4 | E | E | E |

QUARTAMIN 24P (manufactured by Kao Corporation) . . . lauryl trimethyl ammonium chloride
QUARTAMIN 86W (manufactured by Kao Corporation) . . . stearyl trimethyl ammonium chloride

TABLE 4

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 25 | 0.064 | 0.15 | (C1) Surflon S-241: 0.01 (C2) Phosphanol RS-710: 0.01 | 2.0 | 1.4 | E | E | E |
| Example 26 | 0.016 | 0.15 | (C1) Surflon S-241: 0.01 (C2) Phosphanol RS-710: 0.01 | 2.0 | 1.4 | E | E | E |
| Example 27 | 0.008 | 0.15 | (C1) Surflon S-241: 0.01 (C2) Phosphanol RS-710: 0.01 | 2.0 | 1.4 | E | E | E |
| Example 28 | 0.032 | 0.1 | (C1) Surflon S-241: 0.01 (C2) Phosphanol RS-710: 0.01 | 2.0 | 0.9 | E | E | E |
| Example 29 | 0.032 | 0.25 | (C1) Surflon S-241: 0.01 (C2) Phosphanol RS-710: 0.01 | 2.0 | 1.8 | E | E | E |
| Example 30 | 0.032 | 0.15 | (C1) Surflon S-241: 0.01 (C2) Phosphanol RS-710: 0.01 | 0.2 | 3.2 | E | E | E |
| Example 31 | 0.032 | 0.15 | (C1) Surflon S-241: 0.01 (C2) Phosphanol RS-710: 0.01 | 10 | 0.8 | E | E | E |

TABLE 5

| Composition of liquid composition | Component A: potassium permanganate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 32 | 0.032 | 0.15 | (C1) Surflon S-241: 0.005 (C2) Phosphanol RS-710: 0.01 | 2.0 | 1.4 | E | E | E |
| Example 33 | 0.032 | 0.15 | (C1) Surflon S-241: 0.01 (C2) Phosphanol RS-710: 0.005 | 2.0 | 1.4 | E | E | E |
| Example 34 | 0.032 | 0.15 | (C1) Surflon S-241: 0.0075 (C2) Phosphanol RS-710: 0.01 | 2.0 | 1.4 | E | E | E |
| Example 35 | 0.032 | 0.15 | (C1) Surflon S-241: 0.01 (C2) Phosphanol RS-710: 0.0075 | 2.0 | 1.4 | E | E | E |

TABLE 6

| Composition of liquid composition | Component A: potassium permanganate (% by mass) | Component B: (% by mass) | Component C: C1/C2 (% by mass) | Component D: sulfuric acid (% by mass) | pH value of liquid composition | I | II | III |
|---|---|---|---|---|---|---|---|---|
| Example 36 | 0.032 | hydrofluoric acid: 0.08 | (C1) Surflon S-241: 0.01 (C2) Phosphanol RS-710: 0.01 | 0 | 3.1 | E | E | E |
| Example 37 | 0.032 | tetramethylammonium fluoride: 0.38 | (C1) Surflon S-241: 0.01 (C2) Phosphanol RS-710: 0.01 | 2.0 | 1.4 | E | E | E |
| Example 38 | 0.032 | ammonium hexafluorosilicate: 1.0 | (C1) Surflon S-241: 0.01 (C2) Phosphanol RS-710: 0.01 | 2.0 | 1.3 | E | E | E |

TABLE 6-continued

| Composition of liquid composition | Component A: potassium permanganate (% by mass) | Component B: (% by mass) | Component C: C1/C2 (% by mass) | Component D: sulfuric acid (% by mass) | pH value of liquid composition | I | II | III |
|---|---|---|---|---|---|---|---|---|
| Example 39 | 0.032 | ammonium tetrafluoroborate: 1.0 | (C1) Surflon S-241: 0.01<br>(C2) Phosphanol RS-710: 0.01 | 2.0 | 1.1 | E | E | E |

TABLE 7

| Composition of liquid composition | Component A: ammonium peroxodisulfate (% by mass) | Component B: ammonium fluoride (% by mass) | Component C: C1/C2 (% by mass) | Component D: sulfuric acid (% by mass) | pH value of liquid composition | I | II | III |
|---|---|---|---|---|---|---|---|---|
| Example 40 | 1.0 | 0.15 | (C1) Surflon S-241: 0.01<br>(C2) Phosphanol RS-710: 0.01 | 2.0 | 1.6 | E | E | E |
| Example 41 | 5.0 | 0.15 | (C1) Surflon S-241: 0.01<br>(C2) Phosphanol RS-710: 0.01 | 2.0 | 1.6 | E | E | E |

TABLE 8

| Composition of liquid composition | Component A: potassium permanganate (% by mass) | Component B: ammonium fluoride (% by mass) | Component C: (% by mass) | Component D: sulfuric acid (% by mass) | pH value of liquid composition | I | II | III |
|---|---|---|---|---|---|---|---|---|
| Comparative Example 1 | 0.032 | 0.15 | (C1) 1-dodecylpyridinium chloride: 0.01 | 2.0 | 1.4 | E | P | E |
| Comparative Example 2 | 0.032 | 0.15 | (C2) Phosphanol RS-710: 0.01 | 2.0 | 1.4 | E | P | E |
| Comparative Example 3 | 0.032 | 0.15 | (C2) Nymeen F-215: 0.01<br>(C2) Phosphanol RS-710: 0.01 | 2.0 | 1.4 | E | P | E |
| Comparative Example 4 | 0.032 | 0.15 | (C1) Surflon S-241: 0.01<br>polyethylene glycol (average molecular weight 400): 0.01 | 2.0 | 1.4 | E | P | E |
| Comparative Example 5 | 0.2 | 0.15 | (C1) Surflon S-241: 0.01<br>(C2) Phosphanol RS-710: 0.01 | 2.0 | 1.6 | E | P | E |
| Comparative Example 6 | 0.032 | 1.5 | (C1) Surflon S-241: 0.01<br>(C2) Phosphanol RS-710: 0.01 | 2.0 | 3.1 | E | P | P |
| Comparative Example 7 | 0 | 0.15 | (C1) Surflon S-241: 0.01<br>(C2) Phosphanol RS-710: 0.01 | 2.0 | 1.4 | P | E | E |
| Comparative Example 8 | 0.032 | 0 | (C1) Surflon S-241: 0.01<br>(C2) Phosphanol RS-710: 0.01 | 2.0 | 0.8 | P | E | E |
| Comparative Example 9 | 0.032 | 0.15 | (C1) Surflon S-241: 0.01<br>(C2) Phosphanol RS-710: 0.01 | 0 | 6.1 | P | E | E |

TABLE 9

| Composition of liquid composition | hydrogen peroxide (% by mass) | benzyltrimethylammonium hydroxide (% by mass) | 1-hexadecyl-3-methylimidazolium chloride (% by mass) | pH value of liquid composition | I | II | III |
|---|---|---|---|---|---|---|---|
| Comparative Example 10 | 17 | 0.43 | 0.01 | 8.0 | E | P | E |

TABLE 10

| Composition of liquid composition | ammonium iodate (% by mass) | hexafluorosilicic acid (% by mass) | 5-phenyl-1H-tetrazole (% by mass) | myristyltrimethylammonium bromide (% by mass) | pH value of liquid composition | I | II | III |
|---|---|---|---|---|---|---|---|---|
| Comparative Example 11 | 0.005 | 0.4 | 0.03 | 0.1 | 2.4 | P | E | E |

As is clear from the above-described evaluation results, all the liquid compositions of the Examples removed titanium nitride, and tungsten and the low-k interlayer dielectric were not corroded thereby.

INDUSTRIAL APPLICABILITY

The liquid composition of the present invention can be suitably used for cleaning a substrate including titanium nitride, tungsten and a low-k interlayer dielectric, and can remove titanium nitride at a good velocity without corroding tungsten or the low-k interlayer dielectric, thereby attaining high productivity.

EXPLANATIONS OF LETTERS OR NUMERALS 1 titanium nitride
2 low-k interlayer dielectric
3 tungsten

The invention claimed is:
1. A liquid composition, having a pH of 0 to 4 and comprising:
   at least one oxidizing agent (A) selected from the group consisting of potassium permanganate, ammonium peroxodisulfate, potassium peroxodisulfate and sodium peroxodisulfate;
   a fluorine compound (B); and
   a tungsten-corrosion preventer (C),
   wherein the tungsten-corrosion preventer (C) either comprises:
      at least two different compounds selected from a group of compounds (C1) consisting of alkylamines and salts thereof, fluoroalkylamines and salts thereof, alkylamine oxides, fluoroalkylamine oxides, alkyl betaines, fluoroalkyl betaines, alkyl quaternary ammonium and salts thereof, fluoroalkyl quaternary ammonium and salts thereof, alkyl quaternary pyridinium salts, fluoroalkyl quaternary pyridinium salts, alkyl quaternary bipyridinium salts, fluoroalkyl quaternary bipyridinium salts, alkyl quaternary imidazolium salts and fluoroalkyl quaternary imidazolium salts, or
      at least one compound selected from the group of compounds (C1) and at least one compound selected from a group of compounds (C2) consisting of polyoxyalkylene alkylamines, polyoxyalkylene fluoroalkylamines, polyoxyalkylene alkylethers, polyoxyalkylene fluoroalkylethers, polyoxyalkylene alkyl phosphates, polyoxyalkylene fluoroalkyl phosphates, polyoxyalkylene alkylether sulfates, polyoxyalkylene fluoroalkylether sulfates, alkyldiphenyl ether sulfonates and fluoroalkyldiphenyl ether sulfonates, and
   wherein a concentration of potassium permanganate in the oxidizing agent (A) is 0.001 to 0.1% by mass, and wherein a concentration of the fluorine compound (B) is 0.01 to 1% by mass.

2. The liquid composition according to claim 1, which does not comprise hydrogen peroxide.

3. The liquid composition according to claim 1, wherein the fluorine compound (B) is at least one compound selected from the group consisting of hydrofluoric acid, ammonium fluoride, acidic ammonium fluoride, tetramethylammonium fluoride, potassium fluoride, hexafluorosilicic acid and tetrafluoroboric acid.

4. The liquid composition according to claim 1, wherein the tungsten-corrosion preventer (C) comprises the alkylamines or fluoroalkylamines in the group of compounds (C1), having formula (1) below:

wherein:
   $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and
   $R^2$ and $R^3$ represent a hydrogen atom or an alkyl group having 1 to 4 carbon atoms, and a part or all of hydrogen atoms bound to the alkyl group may be substituted with a fluorine atom.

5. The liquid composition according to claim 1, wherein the tungsten-corrosion preventer (C) comprises the alkylamine salts or fluoroalkylamine salts in the group of compounds (C1), which are at least one compound selected from the group consisting of hydrochlorides, nitrates, acetates, methanesulfonates, chlorates, perchlorates, hydrofluorides, hydrobromates, hydroiodides, hydrogensulfates, sulfates, hydrogencarbonates, carbonates, dihydrogen phosphates, hydrogen phosphates and phosphates.

6. The liquid composition according to claim 1, wherein the tungsten-corrosion preventer (C) comprises the alkylamine oxides or fluoroalkylamine oxides in the group of compounds (C1), having formula (2) below:

wherein:
   $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

7. The liquid composition according to claim 1, wherein the tungsten-corrosion preventer (C) comprises the alkyl betaines or fluoroalkyl betaines in the group of compounds (C1), having formula (3) or (4) below:

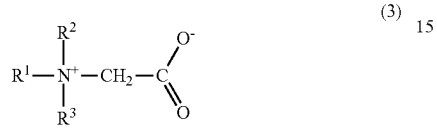
(3)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom;

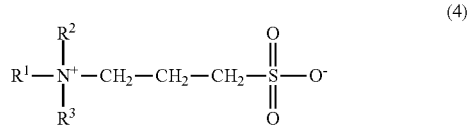
(4)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$ and $R^3$ represent a hydrogen atom or an alkyl group having 1 to 4 carbon atoms, and a part or all of hydrogen atoms bound to the alkyl group may be substituted with a fluorine atom.

8. The liquid composition according to claim 1, wherein the tungsten-corrosion preventer (C) comprises the alkyl quaternary ammonium or salts thereof or fluoroalkyl quaternary ammonium or salts thereof in the group of compounds (C1), having formula (5), (6) or (7) below:

(5)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom;

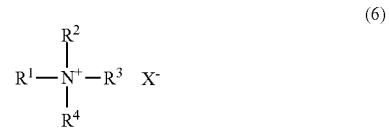
(6)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom; and X represents a halogen atom: F, Cl, Br or I;

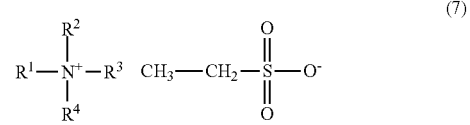
(7)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and $R^2$, $R^3$ and $R^4$ represent a hydrogen atom, an alkyl group having 1 to 4 carbon atoms, a phenyl group or a benzyl group, and a part or all of hydrogen atoms bound to the alkyl group may be substituted with a fluorine atom.

9. The liquid composition according to claim 1, wherein the tungsten-corrosion preventer (C) comprises the alkyl quaternary pyridinium salts or fluoroalkyl quaternary pyridinium salts in the group of compounds (C1), having formula (8) below:

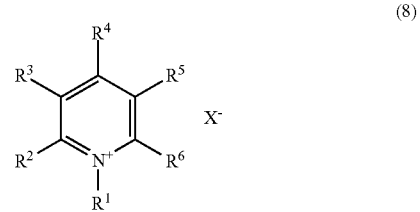
(8)

wherein:
$R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom;

$R^2$, $R^3$, $R^4$, $R^5$ and $R^6$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

10. The liquid composition according to claim 1, wherein the tungsten-corrosion preventer (C) comprises the alkyl quaternary bipyridinium salts or fluoroalkyl quaternary bipyridinium salts in the group of compounds (C1), having formula (9) below:

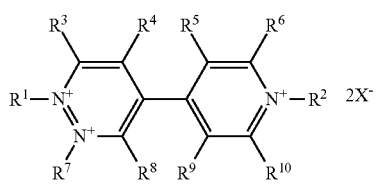
(9)

wherein:
$R^1$ and $R^2$ represent an alkyl group having 8 to 18 carbon atoms or an alkenyl group having 8 to 18 carbon atoms, and a part or all of hydrogen atoms hound to the alkyl group or alkenyl group may be substituted with a fluorine atom;
$R^3$ to $R^{10}$ represent a hydrogen atom or an alkyl group having 1 to 4 carbon atoms, and a part or all of hydrogen atoms bound to the alkyl group may be substituted with a fluorine atom; and
X represents a halogen atom: F, Cl, Br or I.

11. The liquid composition according to claim 1, wherein the tungsten-corrosion preventer (C) comprises the alkyl quaternary imidazolium salts or fluoroalkyl quaternary imidazolium salts in the group of compounds (C1), having formula (10) or (11) below:

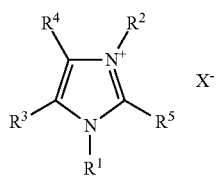
(10)

wherein: $R^1$ represents an alkyl group having 8 to 18 carbon atoms or an alkenyl group having 8 to 18 carbon atoms, and a part or all of hydrogen atoms hound to the alkyl group or alkenyl group may be substituted with a fluorine atom; $R^2$ represents an alkyl group having 1 to 4 carbon atoms, and a part or all of hydrogen atoms bound to the alkyl group may be substituted with a fluorine atom; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I;

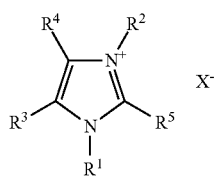
(11)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ to $R^5$ represent a hydrogen atom or an alkyl group having 1 to 4 carbon atoms, and a part or all of hydrogen atoms bound to the alkyl group may be substituted with a fluorine atom; and X represents a halogen atom: F, Cl, Br or I.

12. The liquid composition according to claim 1, wherein the tungsten-corrosion preventer (C) comprises the polyoxyalkylene alkylamines or polyoxyalkylene fluoroalkylamines in the group of compounds (C2), having formula (12) below:

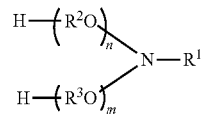
(12)

wherein:
$R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom;
$R^2$ and $R^3$ represent an alkanediyl group having 2 to 6 carbon atoms; and
m and n represent an integer from 2 to 20, and m and n may be the same or different.

13. The liquid composition according to claim 1, wherein the tungsten-corrosion preventer (C) comprises the polyoxyalkylene alkylethers or polyoxyalkylene fluoroalkylethers in the group of compounds (C2), having formula (13) below:

(13)

wherein:
$R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom;
$R^2$ represents an alkanediyl group having 2 to 6 carbon atoms; and
n represents an integer from 2 to 20.

14. The liquid composition according to claim 1, wherein the tungsten-corrosion preventer (C) comprises the polyoxyalkylene alkyl phosphates or polyoxyalkylene fluoroalkyl phosphates in the group of compounds (C2), having formula (14) or (15) below:

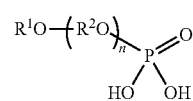
(14)

wherein: $R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^2$ represents an alkanediyl group having 2 to 6 carbon atoms; and n represents an integer from 2 to 20;

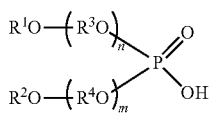

(15)

wherein: $R^1$ and $R^2$ represent an alkyl group having 8 to 18 carbon atoms or an alkenyl group having 8 to 18 carbon atoms, and a part or all of hydrogen atoms bound to the alkyl group or alkenyl group may be substituted with a fluorine atom; $R^3$ and $R^4$ represent an alkanediyl group having 2 to 6 carbon atoms; and m and n represent an integer from 2 to 20, and m and n may be the same or different.

15. The liquid composition according to claim 1, wherein the tungsten-corrosion preventer (C) comprises the polyoxyalkylene alkylether sulfates or polyoxyalkylene fluoroalkylether sulfates in the group of compounds (C2), having formula (16) below:

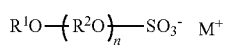

(16)

wherein:
$R^1$ represents an alkyl group having 8 to 18 carbon atoms, an alkenyl group having 8 to 18 carbon atoms, a phenyl group or a benzyl group, and a part or all of hydrogen atoms bound to the alkyl group or alkenyl group may be substituted with a fluorine atom;

$R^2$ represents an alkanediyl group having 2 to 6 carbon atoms;

n represents a number from 2 to 20; and

M represents sodium (Na), potassium (K) or ammonium (NH$_4$).

16. The liquid composition according to claim 1, wherein the tungsten-corrosion preventer (C) comprises the alkyldiphenyl ether sulfonates or fluoroalkyldiphenyl ether sulfonates in the group of compounds (C2), having formula (17) below:

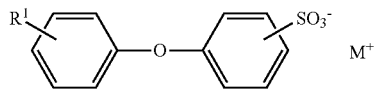

(17)

wherein:
$R^1$ represents an alkyl group having 8 to 18 carbon atoms or an alkenyl group having 8 to 18 carbon atoms, and a part or all of hydrogen atoms bound to the alkyl group or alkenyl group may be substituted with a fluorine atom; and M represents sodium (Na), potassium (K) or ammonium (NH$_4$).

17. The liquid composition according to claim 1, wherein a concentration of ammonium peroxodisulfate, potassium peroxodisulfate or sodium peroxodisulfate in the oxidizing agent (A) is 0.1 to 20% by mass.

18. The liquid composition according to claim 1, wherein a concentration of the tungsten-corrosion preventer (C) is 0.002 to 2% by mass.

19. The liquid composition according to claim 1, wherein a concentration of the compound C1 is 0.001 to 1% by mass and a concentration of the compound C2 is 0.001 to 1% by mass.

20. A method for cleaning a semiconductor device comprising cleaning the device with the liquid composition according to claim 1.

21. A method for producing a semiconductor device, in which titanium nitride is removed from a substrate without corroding tungsten or a low-k interlayer dielectric also present on the substrate, the method comprising bringing the substrate having titanium nitride, tungsten and the low-k interlayer dielectric into contact with the liquid composition according to claim 1.

\* \* \* \* \*